United States Patent
Swoboda

(10) Patent No.: US 8,341,471 B2
(45) Date of Patent: *Dec. 25, 2012

(54) APPARATUS AND METHOD FOR SYNCHRONIZATION WITHIN SYSTEMS HAVING MODULES PROCESSING A CLOCK SIGNAL AT DIFFERENT RATES

(75) Inventor: Gary L. Swoboda, Sugar Land, TX (US)

(73) Assignee: Texas Incorporated Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/007,248

(22) Filed: Jan. 14, 2011

(65) Prior Publication Data
US 2011/0113311 A1 May 12, 2011

Related U.S. Application Data

(63) Continuation of application No. 12/004,876, filed on Dec. 21, 2007, now abandoned.

(51) Int. Cl.
| | |
|---|---|
| *G01R 31/28* | (2006.01) |
| *G01R 27/28* | (2006.01) |
| *G01R 31/00* | (2006.01) |
| *G01R 31/14* | (2006.01) |
| *G01L 15/00* | (2006.01) |
| *G11C 7/00* | (2006.01) |
| *G11C 29/00* | (2006.01) |

(52) U.S. Cl. ........ 714/724; 714/731; 702/117; 702/118; 702/119; 702/120; 702/121; 365/201

(58) Field of Classification Search .................. None
See application file for complete search history.

(56) References Cited

U.S. PATENT DOCUMENTS

| | | | | |
|---|---|---|---|---|
| 4,480,232 A | * | 10/1984 | Baker et al. | 331/1 A |
| 4,683,570 A | * | 7/1987 | Bedard et al. | 714/797 |
| 5,377,205 A | * | 12/1994 | Shi | 714/797 |
| 5,488,613 A | * | 1/1996 | Sridhar | 714/731 |
| 5,557,781 A | * | 9/1996 | Stones et al. | 713/502 |
| 5,572,554 A | * | 11/1996 | Heflin | 375/356 |
| 5,642,069 A | * | 6/1997 | Waite | 327/292 |
| 6,272,647 B1 | * | 8/2001 | Rolston | 713/500 |
| 7,237,136 B2 | * | 6/2007 | Li et al. | 713/401 |
| 2005/0141122 A1 | * | 6/2005 | Hatagami | 360/75 |
| 2009/0160488 A1 | * | 6/2009 | Swoboda | 327/24 |
| 2009/0160507 A1 | * | 6/2009 | Swoboda | 327/144 |

\* cited by examiner

*Primary Examiner* — Guerrier Merant

(74) *Attorney, Agent, or Firm* — Mima Abyad; W. James Brady; Frederick J. Telecky, Jr.

(57) ABSTRACT

In a system in which a plurality of modules have different operational rates and a common clock controlling data delivery to the modules, the rate at which data is delivered to the system can be maximized using a return clock signal to prevent the loss of synchronization of the modules. A clocking error signal may be produced when the clock signal makes a transition to a logic state that may cause loss of synchronization between the modules.

5 Claims, 4 Drawing Sheets

APPARATUS AND METHOD FOR SYNCHRONIZATION WITHIN SYSTEMS HAVING MODULES PROCESSING A CLOCK SIGNAL AT DIFFERENT RATES

CROSS-REFERENCE TO RELATED APPLICATIONS

This application is a continuation of U.S. patent application Ser. No. 12/004,876 filed Dec. 21, 2007.

BACKGROUND OF THE INVENTION

This invention relates to the application of a clock to a plurality of modules that process the clock signal at different rates. In one example, the modules process test and debug signals, such as IEEE 1149.1 clock (and associated information), at different clock rates.

In certain, different modules can process input signals a different clock rates. For example, modules of the ARM Corporation processing units process test and debug signals at different rates. In the JTAG test and debug format, not only is a clock (CLK) signal required, but a return clock (RCLK) signal must be present.

Referring to FIG. 1, the problem engendered by the variable processing rate modules is illustrated. The processing system under test includes modules 1-N. Each module has a (system) CLK signal applied to an input terminal thereof. Each module processes data according to its own internal clock. When the processing of the data is completed, the modules generate RCLK(1) through RCLK(N) signals. In FIG. 1, the application of rest data in TDI(1) through test data out TDI(N) to the modules is illustrated. After processing, the test data out TDO(1) through test data out TDO(N) is retrieved from the modules. In the important JTAG example, the TDI(1) through the TDI(N) are applied, in a series data format, to the modules and the TDO(1) and TDO(N) are retrieved in series format from the modules. Consequently, it is necessary the system clock signal not conflict with any of the RCLK(h) signals or the serial retrieval of the data signals can be compromised. Expressed in another manner, the TDI (k) are entered in the module, processed during the system clock interval and the TDO(k) retrieved from the modules for analysis.

As will be clear, either through failure of the system clock or as a result of variations in the time to process the data signals entered into each module, a timing error can occur and compromise the retrieved data.

It is therefore a feature of the apparatus and associated method to determine when a timing error has occurred in a group of modules that can process portions of a data stream at different rates. It would be yet another feature of the apparatus and associated method to determine when all the return clock signals from the a plurality of modules have a first logic state. It is yet another feature of the present invention to determine when all the module return clock signals have a second logic state. It is yet another feature of the present invention to determine when the return clock signals are inconsistent with the system clock signals. It is a more particular feature of the apparatus and associated method to provide an ERROR signal in the event of potential data corruption in a JTAG test and debug procedure. It is yet a further particular feature of the apparatus and associated to reset the apparatus after the generation of an error signal in response to an externally applied initiation signal.

SUMMARY OF THE INVENTION

The aforementioned and other features are accomplished, according to the present invention, by a first circuit that provides a signal when all of the RCK signals from the modules are in a first state and a second circuit that provides a second signal when the RCLK signals are in a second state. The output signals from the first and second circuits are latched until the opposite state signal is generated. The latched signal is compared to the system clock signal, the system clock being the system clock signal for all of the modules. When the comparison is positive, activity of the modules is continued. When the comparison is negative, an ERROR signal is generated and the results of the previous activity of the modules are discarded. In one implementation, when the ERROR signal is generated, an external signal can initialize the apparatus.

DESCRIPTION OF THE INVENTION

In certain system and chip configurations, different modules can process input signals a different rates or clock rates. For example, modules some of the ARM Corporation processing units process test and debug signals at a rate determined by the module instead of a rate determined by a clock supplied to the module. With these modules logic, the change in state of a clock (CLK) signal provided to the module initiates actions within the module, with the module generating a return clock (RCLK) signal of to indicate the module has completed the action. Each change in state of CLK creates a corresponding change in state of RCLK some time later. Correct operation of the module requires that changes in state of the CLK signal occurs only when the CLK and RCLK signals are the same state.

When multiple modules (1-N) are connected in parallel or series configuration on a board or chip, the changes in state of CLK must be governed by the last module responding to this change in state. In other words, all modules must process a change in state the CLK signal and indicate this with their local RCLK signal before a corresponding change in state of a global RTCK signal returned to the logic generating CLK occurs. This assures the module with the slowest response governs the point at which changes in the state CLK may occur.

A unanimous change is needed by all modules (RCLK 1-N are either a logic 1 or logic 0) to change the state of RCLK. As such, a change in RCLK 1-N to logic 1 changes RCLK to logic 1 and a change in RCLK 1-N to logic 0 changes RCLK to logic 0.

Figure 1:
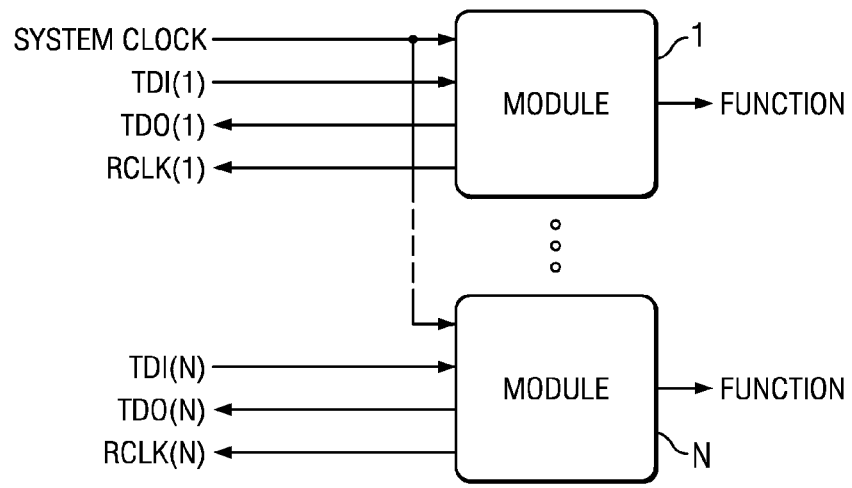
FIG. 1 is a block diagram of a system having a plurality of modules processing data signals at different rates according to the prior art.

Referring to FIG. 1, the problem engendered by the variable processing rate modules is illustrated. The processing system under test includes modules 1-N. Each module has a (system) CLK signal applied to an input terminal thereof. Each module reacts to the changes in state of the CLK signal at its own pace (i.e. according to its own internal clock). When the processing of the data associated with the CLK signal is complete, the modules generate RCLK(1) through RCLK(N) signals. The exchange of test data in and test data out (TDI(1) and TDO(1) through (TDI(N) and TDO(N)) is also illustrated in this FIG. Changes in the state of the CLK signal cause the input and output of this data.

In the important 1149.1 example, the logic sourcing CLK presents data to the modules via the TDI(1) through the TDI(N) signals and the modules present data to the logic sourcing CLK via the TDO(1) and TDO(N) signals. Changes in the state of the system clock signal must be restricted to times where the logic state of the CLK signal and all of the RCLK(h) signals is the same to assure a correct exchange of data.

Conversely, changes in the state of the system clock signal at times where the logic state of the CLK signal and all of the RCLK(h) signals is not the same will likely result in an incorrect exchange of data. A failure of the circuit generating system clock in response to a fixed frequency CLK signal and variations in the time to process the changes in state of the clock signal entered into each module, a timing error can occur and compromise the retrieved data.

It is therefore a feature of the apparatus and associated method to determine when a timing error has occurred in a group of modules that can process portions of a data stream at different rates. It would be yet another feature of the apparatus and associated method to determine when all the return clock signals from the a plurality of modules have a first logic state. It is yet another feature of the present invention to determine when all the module return clock signals have a second logic state. It is yet another feature of the present invention to determine when the return clock signals are inconsistent with the system clock signals. It is a more particular feature of the apparatus and associated method to provide an ERROR signal in the event of potential data corruption in a JTAG test and debug procedure. It is yet a further particular feature of the apparatus and associated to reset the apparatus after the generation of an error signal in response to an externally applied initiation signal Referring to FIG. 2, a block diagram of the present invention is shown. As In FIG. 1, module 1 through module N process input data signals TDI(1) through TDI(N), respectively, at different rates. In the preferred embodiment, the TDI(1) through TDI(N) are shifted into the modules over a serial conducting path. A system clock CLK signal is applied to each of the module. The RCLK(1) through RCLK(N) signals are applied to RCLK creation circuit 20 where the signals are combined. The output signal from the RCLK creation circuit 20 is the RCLK signal presented to the logic generating the CLK signal.

Figure 3:
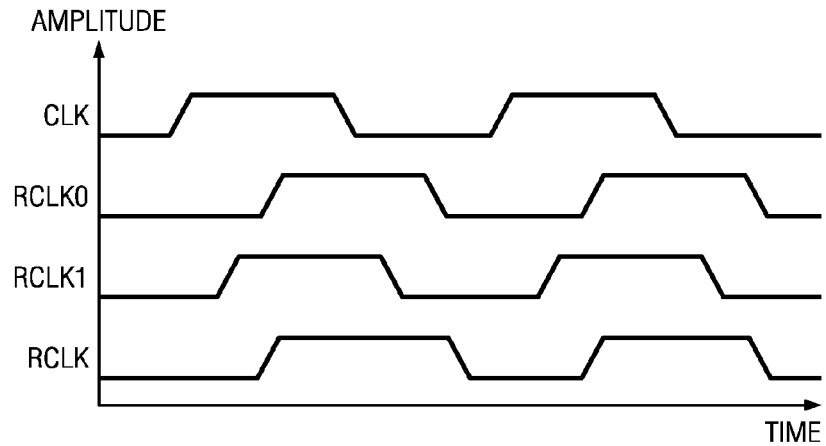
FIG. 3 illustrates the signals generated by the circuit of FIG. 2.

Referring to FIG. 3, the clock waveforms for an embodiment with two modules is shown. The CLK signal provides the system clock for all of the modules. These modules process changes in the state of the CLK signal at different rates. Consequently, the RCLK(1) signal and other module's clock signal are not in general synchronized with the system clock or with each other. The RCLK creation circuit 20 shown in FIG. 4 combines the two RCLK signals, creating a logic 1 RCLK state when all of the module RCLK signals have reached the logic 1 state (i.e., each component RCLK signal is a logic 1). Similarly, a logic 0 RCLK signal is created when all of the RCLK(k) signals reach the logic 0 state. The state of the RCLK signal does not change in cases where the logic state of the RCLK(k) signals is not the same. In the example of FIG. 3, the RCLK(1) signal reaches a logic 1 state first, with the RCLK(0) signal determining the point a logic 1 RCLK state is created. The RCLK(0) signal reaches a logic 0 state first, with the RCLK(0) signal determining the point a logic 0 RCLK state is created. Therefore, the RCLK(1) signal and the RCLK signal appear to be synchronous.

Figure 2:
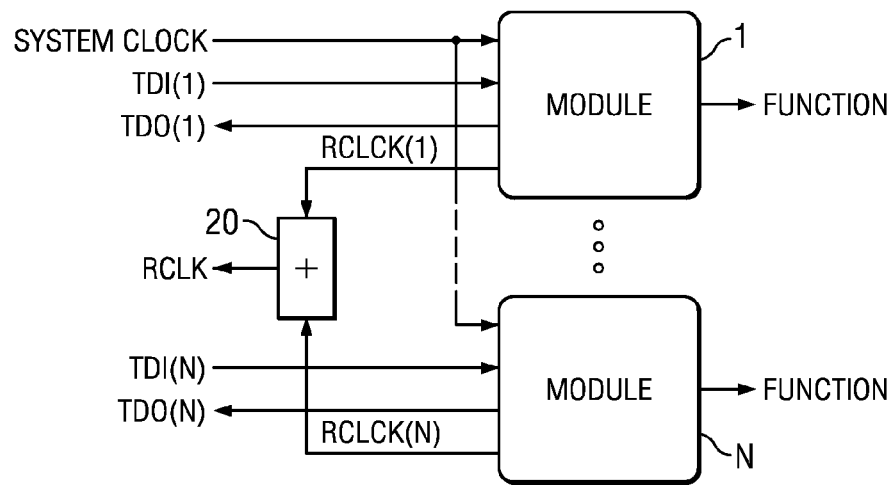
FIG. 2 is a block diagram of a system having a plurality of modules processing data signals at different rates according to the present invention.
Figure 4:
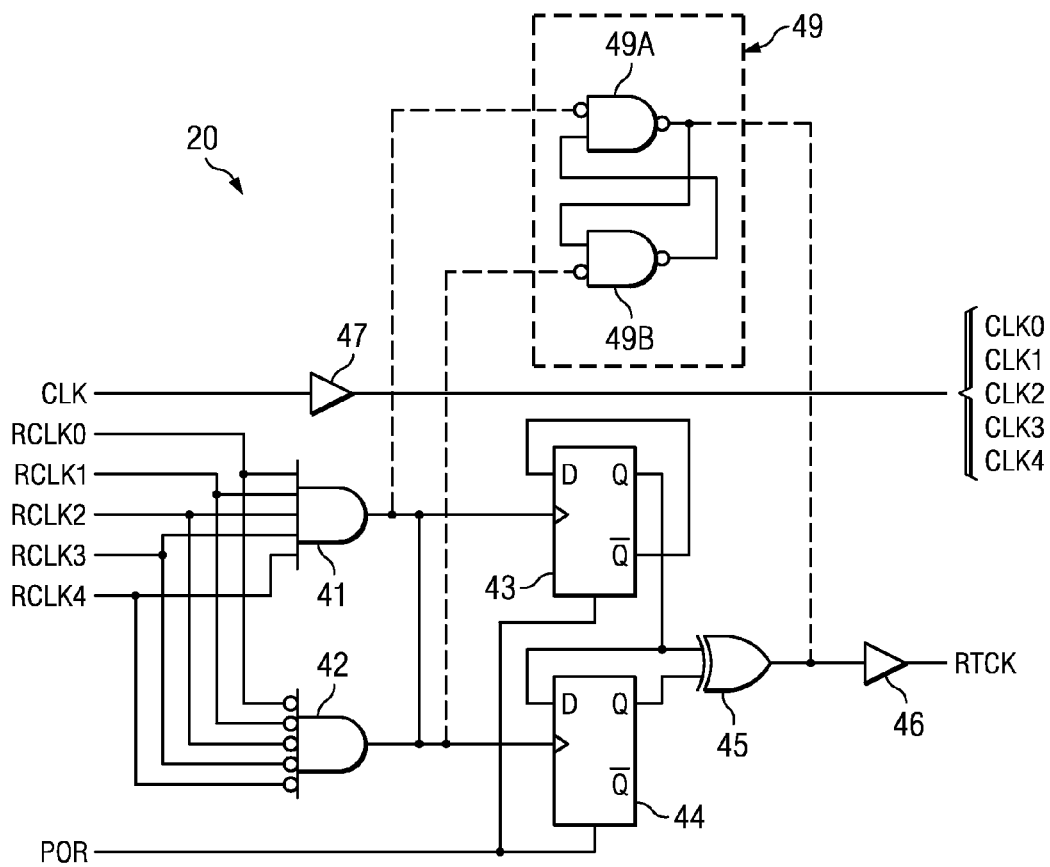
FIG. 4 is a block diagram showing an implementation of the circuits for generating a composite return clock (RCLK) signal according to the present invention.

Referring to FIG. 4, an implementation of the RCLK creation circuit 20 of FIG. 2 is shown. In the example of FIG. 4, five modules are assumed to be present. The RCLK(0) through RCLK(4) signals are applied to the inputs of logic AND gate 41 and these same signals are inverted and applied to the inputs of logic AND put terminals of logic AND gate 42. The output terminal of logic AND gate 41 is connected to the clock terminal of D flip-flop 43. The output terminal of logic AND gate 42 is connected to the clock terminal of D flip-flop 44. A POR (Power On Reset) signal is applied to the clear terminals of D flip-flop 43 and D flip-flop 44. The Q' terminal of D flip-flop 43 is applied to the D terminal of D flip-flop 43. The Q terminal of D flip-flop 43 is applied to the D terminal of D flip-flop 44 and to a first input terminal of exclusive OR gate 45. The Q terminal of D flip-flop 44 is applied to a second input terminal of exclusive OR gate 45. The output signal of exclusive OR gate 45 is buffered with driver 46 to become the global RCLK signal. FIG. 4 also indicates that the CLK signal is the CLK signal for the modules 1 through 4.

Another embodiment for implementing RCLK generation is with the latch circuit, as shown in the dotted box 49. The output terminal of logic AND gate 41 is connected to an inverting terminal of logic NAND gate 49A, while the output terminal of logic AND gate 42 is connected to an inverting terminal of logic NAND gate 49B. The output terminal of logic NAND gate 49A is coupled to a second input terminal of logic NAND gate 49B, while the output terminal of logic NAND gate 49B is coupled to a second input terminal of logic NAND gate 49A. The output terminal of logic NAND gate 49A sources the global RCLK signal.

Figure 5:
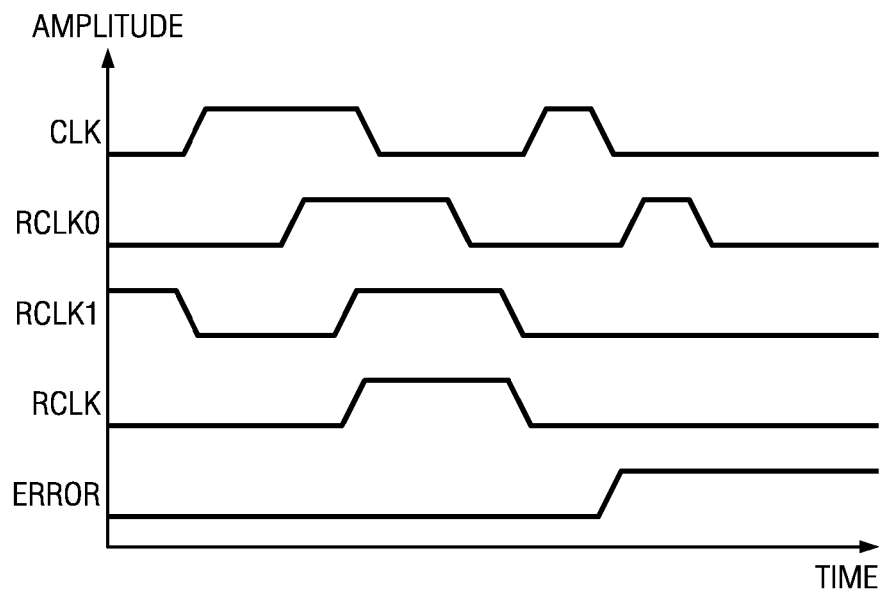
FIG. 5 illustrates waveforms from the apparatus in FIG. 4 when an error is generated by the operation of the circuits.
Figure 7:
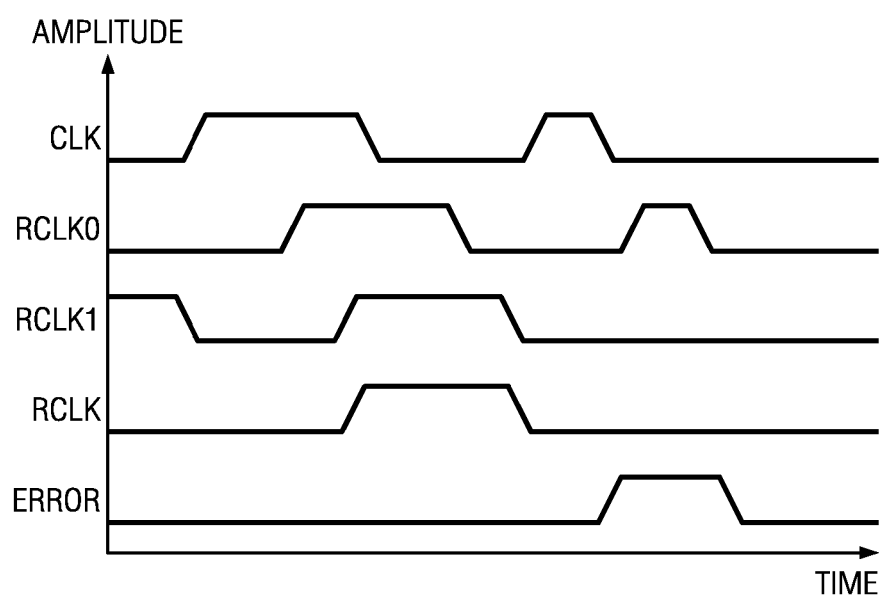
FIG. 7 illustrates the waveforms of the circuit of FIG. 6 including the initialization of the circuit.

Referring to FIG. 5, the relationship of the clock signals that provides an ERROR signal. In this example, the second clock pulse returns to zero while the RCLK signal is still zero, i.e., at least one of the RCLK(h) signals is still zero. At this time, an ERROR signal is generated.

Figure 6:
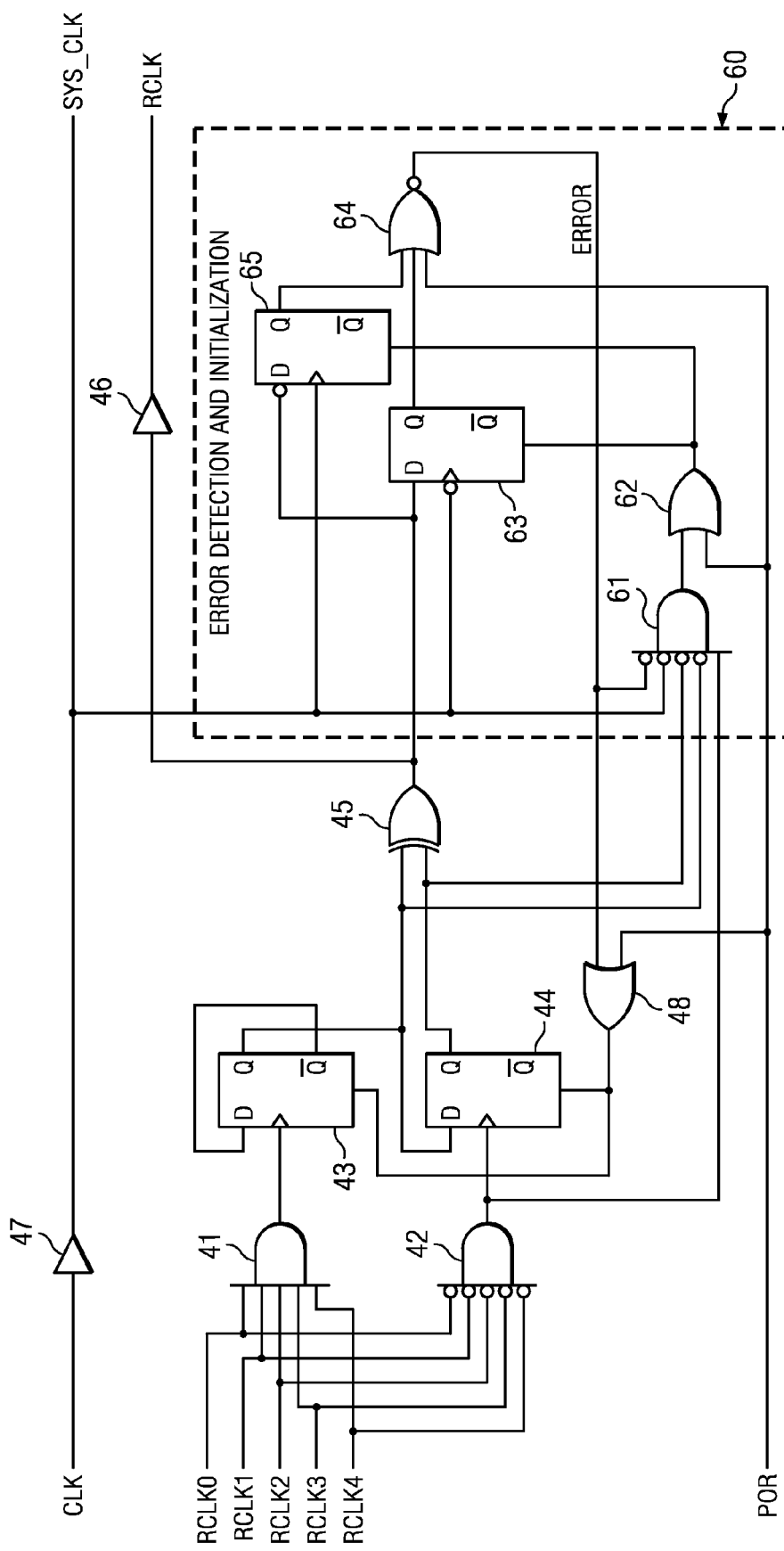
FIG. 6 illustrates a circuit for generating an ERROR signal and for initializing the circuit after generation of the error signal according to the present invention.

Referring to FIG. 6, in order to create the ERROR signal of FIG. 5; an Error Detection and Initialization Unit 60 is shown. Components 41, 42, 43, 44, 45 and 46 are the same as in FIG. 4 except that the POR signal is not directly applied to the clear terminal of D flip-flop 43 and D flip-flop 44. Instead, the POR signal is applied to a first terminal of logic OR gate 48, to a first terminal of logic OR gate 62, and to a first input terminal of logic NOR gate 64. The output terminal of logic XOR gate 45, in addition to being applied to buffer 46, is applied to a D terminal of D flip-flop 63 and to a D terminal of D flip-flop 64. The output terminal of logic NAND gate 42 is applied to a first terminal of logic AND gate 61. The first input terminal of XOR gate 45 is coupled to an inverting second terminal of logic AND gate 61, the second input terminal of XOR gate 45 is coupled to an inverting third input terminal of AND gate 61, and the ERROR signal is applied to a fourth terminal of logic AND gate 61. The ERROR signal is also applied to a second input terminal of logic OR gate 48. The SYS_CLK signal is applied to an inverting fifth terminal of logic AND gate 61, to the clock terminal of D flip-flop 63, and to the clock terminal of D flip-flop 64. The output terminal of logic AND gate 61 is coupled to a second input terminal of logic OR gate 62. The output terminal of logic OR gate 62 is applied to the clear terminal of D flip-flop 63 and to the clear terminal of D flip-flop 64. The Q terminal of D flip-flop 63 is coupled to a second input terminal of logic NOR gate 64, while the Q terminal of D flip-flop 64 is coupled to a third input terminal of logic NOR gate 64. The ERROR signal is applied to the output terminal of logic NOR gate 64.

The operation of the present invention can be understood as follows. A first circuit has all the return clock signals applied thereto. When the return signal has the same logic state, a first logic state is latched. This first logic state remains latched until all of the return clock signals reach the opposite logic state. At this point, a second logic state is latched. The latched signal is compared to the logic level of the transitioning clock signal. When the clock signal transitions to the same logic level as the latched signal, an ERROR signal is generated. The ERROR signal remains latched until an initialize (POR) signal is applied to the circuit.

Using the circuit shown in FIG. 6, the ERROR signal is generated, but the ERROR signal is also available to help reinitialize the ERROR signal generating circuit. In addition to the ERROR signal, the initialization requires an externally applied signal. In FIG. 6, this signal is labeled the POR signal.

While the invention has been described with respect to the embodiments set forth above, the invention is not necessarily limited to these embodiments. Accordingly, other embodiments, variations and improvements not described herein are not necessarily excluded from the scope of the invention, the scope of the invention being defined by the following claims.

What is claimed is:

1. An apparatus for detecting an error in the clocking of a circuit, the circuit comprising;
    a plurality of modules processing data signals applied thereto at different rates, the modules having a clock signal applied thereto, each module generating a RCLK signal indicating that the processing of the previous edge of the system clock has been completed by the module; and
    an error detection unit for generating an error signal when a transition in the state of the system clock signal occurs while any of the plurality of modules is processing inputs.

2. The apparatus of claim 1 further comprising a reset circuit responsive to the error signal and an external signal, the reset circuit removing the error signal.

3. The apparatus of claim 1 wherein the apparatus is utilized in a JTAG test and debug system.

4. The apparatus of claim 3 wherein the modules being tested include module in processing machines by ARM Corporation.

5. The apparatus of claim 1 further comprising a reset circuit for removing the ERROR signal.

* * * * *